US008836422B2

(12) United States Patent
Wimpenny

(10) Patent No.: US 8,836,422 B2
(45) Date of Patent: Sep. 16, 2014

(54) CONTROL LOOP FOR AMPLIFICATION STAGE

(75) Inventor: Gerard Wimpenny, Cambourne (GB)

(73) Assignee: Nujira Limited (GB)

( * ) Notice: Subject to any disclaimer, the term of this patent is extended or adjusted under 35 U.S.C. 154(b) by 16 days.

(21) Appl. No.: 12/919,525

(22) PCT Filed: Feb. 27, 2009

(86) PCT No.: PCT/EP2009/052411
§ 371 (c)(1),
(2), (4) Date: Dec. 17, 2010

(87) PCT Pub. No.: WO2009/106632
PCT Pub. Date: Sep. 3, 2009

(65) Prior Publication Data
US 2011/0089990 A1    Apr. 21, 2011

(30) Foreign Application Priority Data

Feb. 28, 2008 (GB) .................................. 0803711.1

(51) Int. Cl.
*H03G 3/00* (2006.01)
*H03F 1/02* (2006.01)

(52) U.S. Cl.
CPC .................................. *H03F 1/0222* (2013.01)
USPC ............................ 330/127; 323/355; 327/363

(58) Field of Classification Search
USPC ......... 327/103, 131, 139, 155, 355, 363, 403; 323/212, 215, 234, 247, 299, 301, 304, 323/305, 355, 356; 330/75, 85, 127, 199
See application file for complete search history.

(56) References Cited

U.S. PATENT DOCUMENTS

| 6,084,468 | A * | 7/2000 | Sigmon et al. | 330/136 |
| 6,788,151 | B2 * | 9/2004 | Shvarts et al. | 330/297 |
| 7,696,818 | B2 * | 4/2010 | Kunihiro et al. | 330/10 |
| 2002/0030543 | A1 | 3/2002 | French et al. | |

(Continued)

FOREIGN PATENT DOCUMENTS

| EP | 1703635 A1 | 9/2006 |
| GB | 2 398 648 A | 8/2004 |

(Continued)

OTHER PUBLICATIONS

"British Search Report for International Application No. GB 0803711.1", dated: May 28, 2009, Publisher: Intellectual Property Office / British Patent Office, Published in: South Wales.

(Continued)

*Primary Examiner* — Patrick O'Neill
(74) *Attorney, Agent, or Firm* — Kaplan Breyer Schwarz & Ottesen, LLP

(57) ABSTRACT

There is disclosed a method and apparatus for generating an output signal comprising a replica of an input signal, comprising the steps of: generating a replica signal representing the low frequency content of the input signal; generating an error signal representing an error in the replica signal; combining the replica signal with the error signal to generate an output signal; and wherein the step of generating the error signal further includes the steps of: generating a delay signal being a delayed version of the input signal; and determining a difference between the output signal and the delay signal which difference is the error signal.

22 Claims, 5 Drawing Sheets

(56) References Cited

U.S. PATENT DOCUMENTS

| | | | |
|---|---|---|---|
| 2007/0210771 A1 | 9/2007 | Wilson et al. | |
| 2007/0279019 A1* | 12/2007 | Wilson | 323/255 |
| 2008/0258831 A1 | 10/2008 | Kunihiro et al. | |

FOREIGN PATENT DOCUMENTS

| | | |
|---|---|---|
| JP | 59152712 A | 8/1984 |
| WO | 2005057769 A1 | 6/2005 |
| WO | 2006/021790 A1 | 3/2006 |
| WO | 2007080741 A1 | 7/2007 |
| WO | WO 2007080741 A1 * | 7/2007 |

OTHER PUBLICATIONS

"International Search Report and Written Opinion for International Application No. PCT/EP2009/052411", Dated: Jun. 25, 2009, Publisher: European Patent Office/ International Searching Authority, Published in: Netherlands.

Weihua Zhao, "Chinese Patent Application No. 200980106934.0 Office Action", Jun. 20, 2012, Published in: CN.

"Related Japanese Patent Application No. 2010-548131 Office Action", Apr. 23, 2013, Publisher: JPO, Published in: JP.

* cited by examiner

CONTROL LOOP FOR AMPLIFICATION STAGE

BACKGROUND TO THE INVENTION

1. Field of the Invention

The present invention relates to control systems using multiple control loops, and particularly but not exclusively to control loops in an amplification stage for providing a modulated supply voltage.

2. Description of Related Art

Conventional multi-loop or cascaded control systems may be divided according to speed of operation: each loop may operate at a different frequency in accordance with its purpose in the control system. However each loop must typically be able to operate over the full frequency range of the control system, typically down to zero hertz, i.e. each loop must be able to provide a constant output.

In a control system having more than one control loop, typically a first path provides control at low frequencies. This first path may be a feedforward of a feedback control path. A second path typically provides control at a higher frequency, to remove or reduce any error in the first path. This second path is typically a feedback path.

An example application of such a control system is a modulated power supply for providing a supply voltage to an amplification stage, typically a radio frequency (RF) amplification stage. An example of a particularly advantageous modulated power supply stage can be found in United Kingdom Patent No. 2398648.

In this modulated power supply stage there is provided an efficient technique for tracking the supply voltage to an RF amplifier in dependence on the RF input signal to be amplified by the amplifier. A first control loop tracks the envelope of the input signal, representing a desired supply voltage for the amplification stage, and selects one of a plurality of available supply voltages in dependence thereon. A second control loop tracks the envelope of the input signal and the actual output signal, and generates an error signal representing the difference there between. This error signal is combined with the selected supply voltage to provide an adjusted selected supply voltage for the amplification stage. The first control loop is a low frequency loop, and the second control loop is a high frequency loop.

The error signal provided by the second loop contains high and low frequency signals, and has a very large bandwidth. This places a burden on a combiner used for combining the error signal with the selected supply voltage. This combiner must be capable of operating over an extremely high bandwidth, and typically will operate on the edge of its capabilities.

The use of delay stages in control systems is well-known. United Kingdom Patent No. 2398648 discussed above utilises a delay stage in the power supply modulator. European Patent Application Publication No. 1703635 and Japanese Patent Application No. 59152712 also disclose the use of delay stages in control systems.

It is an aim of the invention to provide a technique to reduce the bandwidth and dynamic range burden on the signal combiner in such arrangements.

SUMMARY OF THE INVENTION

In accordance with the invention there is provided a control stage comprising: a first path for receiving an input signal and for generating a replica signal representing the low frequency content of such signal; a second path for receiving the input signal and for generating an error signal representing an error in the replica signal; a combiner for combining the replica signal with the error signal to generate an output signal; and wherein the second path further includes: a delay stage for generating a delay signal being a delayed version of the input signal; and a difference block for receiving as inputs the output signal and the delay signal and for generating the error signal.

The delay preferably corresponds to a delay of the first path. The delay is preferably calculated such that a low frequency error is removed from the error signal.

The input signal preferably represents an envelope of a signal. The output signal is preferably a signal having a shape corresponding to the envelope.

The output signal is preferably a high power replica of the input signal.

There is preferably provided, in the first path, a pre-compensation/distortion means to compensate for distortion occurring in the first path, such that the output signal has a flat amplitude and constant delay.

The error signal preferably represents the high frequency content of the error in the replica signal.

In accordance with the present invention there is provided a modulator comprising: a first amplification stage for receiving an input signal and for generating a high power signal being a replica of the low frequency content of the input signal; a second amplification stage for receiving the input signal and for generating an error signal representing an error in the high power signal; and a combiner for combining the high power signal with the error signal to generate an output signal; wherein the second amplification stage includes: a delay stage for generating a delay signal being a delayed version of the input signal, the delay corresponding to a delay of the first amplification stage; and a difference block for combining the output signal with the delay signal to generate the error signal, wherein the delay removes a low frequency error from the error signal.

The first amplification stage preferably includes a switcher and a comparator, the comparator being connected to receive the input signal and the output of the switcher, and to generate a difference signal corresponding to the difference there between for providing the input to the switcher.

The modulator preferably further comprises a low-pass filter for filtering the output of the switcher and for providing the first amplification stage output.

The modulator preferably further comprises a low-pass filter for providing the input signal to the comparator of the first amplification stage.

There is preferably provided, in the first amplification stage, a pre-compensation/distortion means to compensate for distortion occurring in the first amplification stage, such that the output signal has a flat amplitude and constant delay.

In accordance with the invention there is provided a method of generating an output signal comprising a replica of an input signal, comprising the steps of: generating a replica signal representing the low frequency content of the input signal; generating an error signal representing an error in the replica signal; combining the replica signal with the error signal to generate an output signal; and wherein the step of generating the error signal further includes the steps of: generating a delay signal being a delayed version of the input signal; and determining a difference between the output signal and the delay signal which difference is the error signal.

The step of determining the difference between the output signal and the delay signal advantageously results in the low frequency components of the error signal being reduced, minimised, or removed.

The delay preferably corresponds to a delay of the low frequency path. The delay is preferably calculated such that a low frequency error is removed from the error signal.

The input signal preferably represents an envelope of a signal.

The output signal is preferably a signal having a shape corresponding to the envelope. The error signal preferably represents the high frequency content of the error in the replica signal.

A modulator is preferably adapted to perform the method. An amplification stage is preferably adapted to perform the method, wherein the input signal represents an envelope of a signal to be amplified, and the output signal is a power supply to the amplifier.

The invention introduces a delay in the path of a high frequency feedback loop. The value of the delay is chosen to equal the total delay in an associated low frequency path. The use of the delay reduces the low frequency content of the signal in the high frequency path, and the dynamic range requirements of the high frequency feedback loop.

Provided the low frequency path and the high frequency path are amplitude balanced, the two paths may be delay balanced at low frequencies such that the high frequency loop provides no low frequency output.

Optimum performance is attained when the delay matches the delay in the low frequency path over the frequency range of interest.

In general the invention allows for a control system in which only one of multiple control loops is required to provide a constant output including low frequency components. Other loops do not need to operate at low frequency.

The absence of low frequency signals in the high frequency loop means that the high frequency loop can therefore be AC coupled with the low frequency loop. AC coupling may be achieved by transformer coupling or capacitor coupling.

BRIEF DESCRIPTION OF THE FIGURES

The invention will now be described by way of example with reference to embodiments and the following Figures in which.

DESCRIPTION OF PREFERRED EMBODIMENTS

The invention is now described below by way of example with reference to non-limiting embodiments, and particularly in the exemplary context of a modulated power supply stage.

Figure 1:
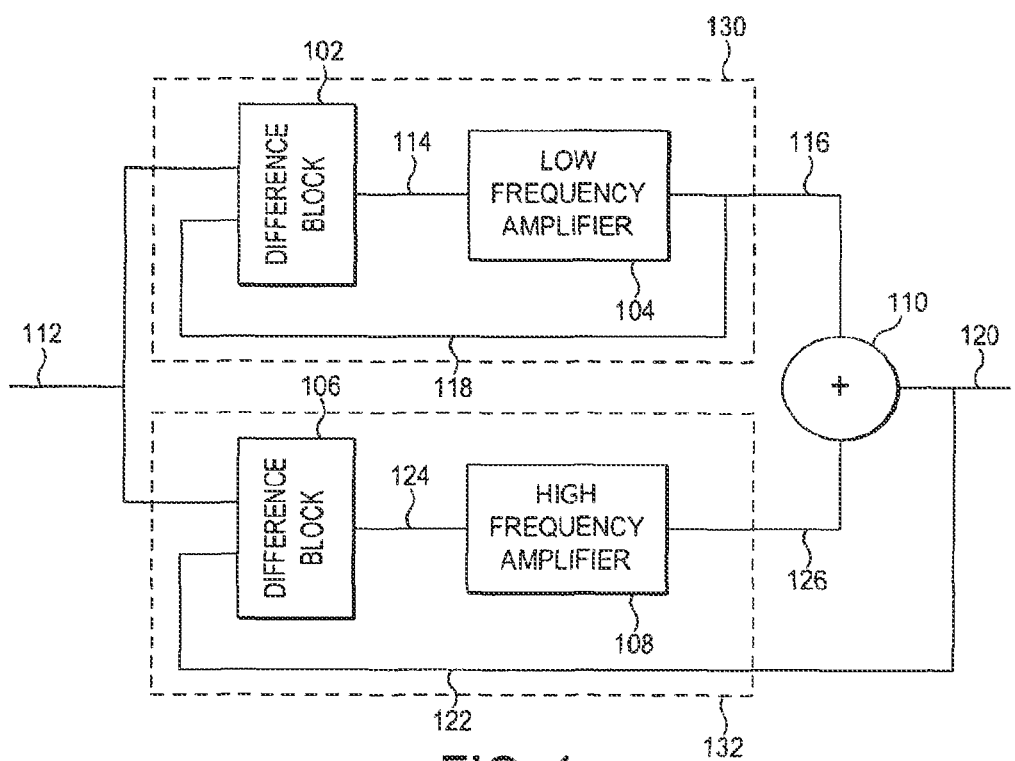
FIG. 1 illustrates a conventional dual-loop control system.

FIG. 1 illustrates an exemplary control system typical of a prior art arrangement. A difference block 102 and a low frequency amplifier 104 define a first path 130. The first path may also be referred to as a first control path, or a main path. A difference block 106 and a high frequency amplifier 108 define a second path 132. The second path may also be referred to as a second control path or an error correction path. In general, the second path removes an error from the first path, as will be understood from the following description.

A summer or combiner 110 is provided to combine the two control paths. The objective of the control system is to provide on an output line 120 a signal which is an accurate replica of an input signal provided on line 112. In a preferred arrangement the output signal on line 120 is an amplified version of the input signal on line 112. The control system preferably provides an output signal on line 120 having a much larger current available than is associated with the input signal on line 112. Such a system may be advantageously used as a high efficiency modulated or tracking power supply, with a load connected to the output signal line 120.

The input signal on line 112 provides a first input to each of the difference blocks 102 and 106. The difference block 102 forms an output on line 114 to the low frequency amplifier 104. The output of the low frequency amplifier 104 on line 116 forms a first input to the combiner 110, and is also fed back via line 118 to form a second input to the difference block 102. The difference block 106 forms an output on line 124 to provide an input to the high frequency amplifier 108. The high frequency amplifier 108 provides an output on line 126 which forms a second input to the combiner 110. The combiner 110 combines the signals on lines 116 and 126 to form the output signal on line 120. The output signal on line 120 is also fed back via line 122 to form the second input to the difference block 106.

In an example application where the input signal on line 112 is an envelope derived from a video signal to be amplified, the signal has a wide frequency spectrum compared to the operating frequency bandwidth of the low frequency amplifier 104. In this system the low frequency amplifier 104 provides a large portion of the output power delivered on the output signal line 120, but is incapable of operating at the higher frequency range of the input signal. The high frequency amplifier 108 effectively operates as an error correcting or clean-up loop to provide the missing part of the output signal on line 120. The error correction or clean-up is provided by summing the signal on line 126 with the signal on line 116 to deliver a desired output signal on line 120.

In the typical prior art arrangement of FIG. 1, the high frequency amplifier 108 must be able to operate over almost the full frequency range of the input signal. As discussed in the background to the invention section above, this creates demands on the dynamic range and fractional bandwidth of the high frequency amplifier 108, and particularly creates demands on the design of the combiner 110 which must be capable of operating at a very high fractional bandwidth and in practice operates at the extremes of its bandwidth.

Figure 2:
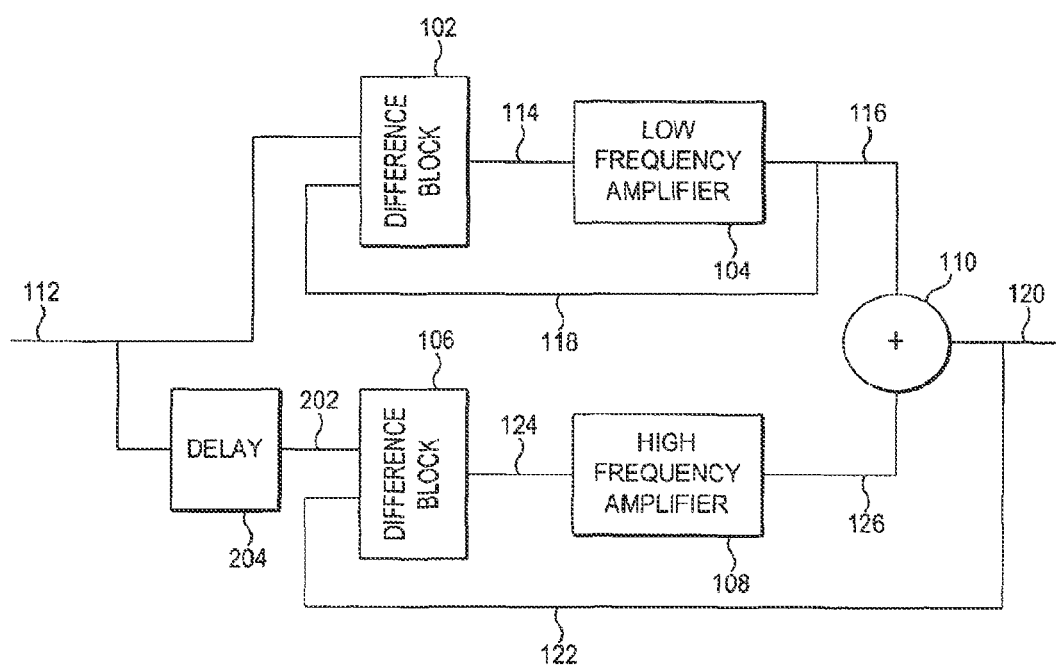
FIG. 2 illustrates an improved dual-loop control system in accordance with an embodiment of the invention.

In accordance with the invention there is provided a technique to reduce the low frequency content of the signal provided to the high frequency amplifier 108. The modification of the control system of FIG. 1 in accordance with the principles of the present invention is illustrated in FIG. 2. In all the following Figures, where any element shown corresponds to an element shown in a previous figure, like reference numerals are used.

With reference to FIG. 2 it can be seen that the control system of FIG. 1 is adapted in order to provide a delay block 204 between the input signal on line 112 and the first input to the difference block 106. Thus the delay block 204 receives the input signal on line 112 and provides an output on line 202 which forms the first input to the difference block 106.

The delay block 204 adapts the control system such that the signals at the two inputs of the difference block 106 are identical over a frequency range of interest. In the arrangement of FIG. 1 a finite delay is introduced in the control loop 130. The delay 204 of the arrangement of FIG. 2 thus operates as a balancing delay, delaying the signal applied to the first input of the difference block 106 by an amount corresponding to the delay of the first control loop and present in the signal delivered to the second input of the difference block 106 on line 122. The balancing delay afforded by the delay block 204 is substantially constant over at least the operating frequency range of the low frequency amplifier 104.

The signals on lines 202 and 122 are thus time-synchronised. Thus the provision of the delay block 204 ensures that the difference block 106 provides an output on line 124 which has no low frequency signals.

The cancellation of the low frequency signals in this way means that the high frequency amplifier 108 is not required to amplify those signals, and the combiner 110 is not required to handle those signals on the input line 126. Thus the removal of the low frequency content in this way allows for signal coupling in the combiner 110 using, for example, a transformer or a capacitor. The use of a transformer for the combiner 110 is a particularly advantageous arrangement.

If the delay block 204 is not provided it may not be possible to use a transformer for the combiner 110.

Preferably the delay provided by the delay block 204 is a digital delay. A digital delay is preferable as this provides a constant delay at all frequencies. A digital delay is appropriate where the input signal is in digital form. The invention, and embodiments thereof, are not limited to digital delays. The delay can be implemented as an analogue network, as is described further hereinbelow in the context of a specific embodiment.

An overview of the operation of the control system of FIG. 2 is now described. An accurate copy of the input signal applied on line 112 is generated on line 116 by the difference block 102 and the low frequency amplifier 104 in conjunction with their associated feedback. This is achieved at low frequency. Over some portion, or preferably all, of the frequency range of operation of the difference block 102 and the low frequency amplifier 104 the delay between signal line 112 and signal line 116 is substantially constant. In addition the amplitude response between the signals on lines 112 and 116 is preferably substantially flat over the frequency range of interest. This ensures best cancellation (of the low frequency elements) is achieved on signal line 126 in the high frequency control loop.

As discussed hereinabove the delay block 204 provides an equal delay to balance the delay through the difference block 102 and the low frequency amplifier 104. The delayed input signal on line 202 is equal to the output signal on line 116 from the first control loop over the part of the frequency range where both delay balance is achieved and the output on line 116 is an accurate replica of the input signal. Therefore the output of the difference block 106 on line 124 is ideally zero, and the high frequency amplifier 108 does not provide any output power, over this frequency range. Outside of this frequency range, however, the high frequency amplifier 108 operates as in a conventional system such as shown in FIG. 1, and provides the difference between the signals on lines 116 and 202 on line 124.

The output signal on line 120 is a delayed replica of the input signal on line 112. In a practical implementation perfect balance may not be attainable. Nevertheless the output of the high frequency amplifier 108 is substantially reduced over the low frequency range. The delay balancing block 204 provides a substantial benefit by increasing the low frequency cut-off of the high frequency amplifier 108.

This arrangement is particularly beneficial when the envelope signal is a time division duplex (TDD) signal, such as a signal in WiMax (worldwide interoperability for microwave access) technology. In such signals sudden changes in the low frequency content of the signal occur. Without delay balancing in accordance with the techniques of the invention the dynamic range requirement of the high frequency amplifier is significantly increased to avoid saturation at the start of TDD bursts.

Figure 3:
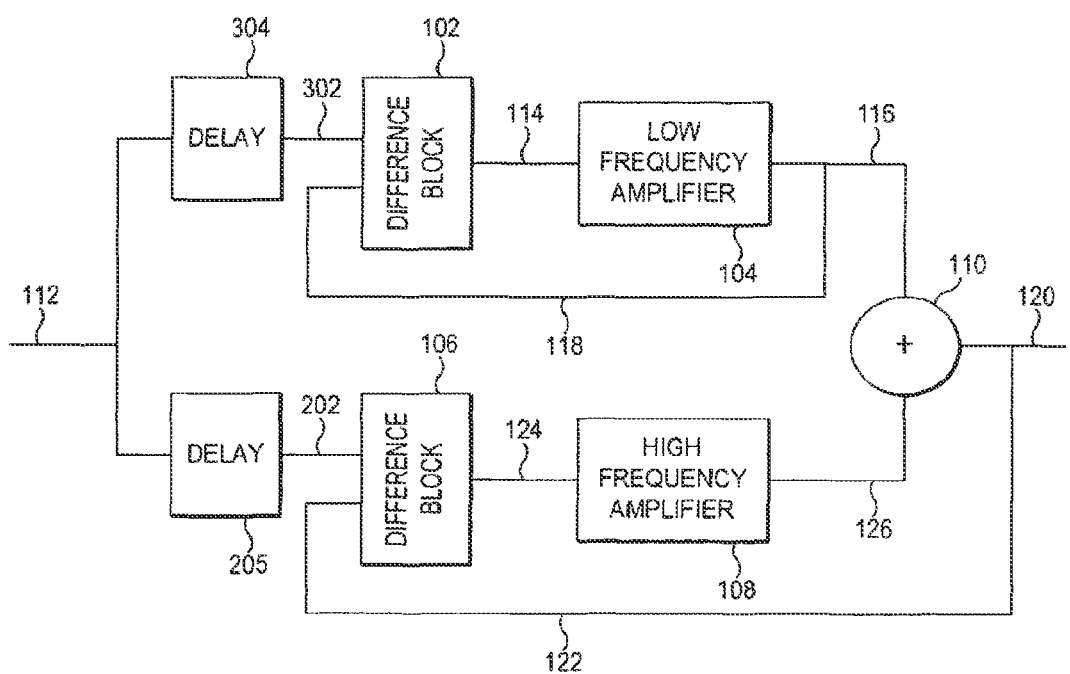
FIG. 3 illustrates an improved dual-loop control system in accordance with a further embodiment of the invention.

An alternative approach to the delay balancing principle of the present invention is to allow the delay of the delay block 204 to vary with frequency. The delay variation of the delay block 204 can be matched to the delay variation of the low frequency path through the difference block 102 and the low frequency amplifier 104. Depending on the response to be matched, however, it may be necessary to insert an additional delay in the low frequency path to achieve delay balance. This is illustrated in FIG. 3, where a further delay block 304 is introduced between the input signal on line 112 and the first input to the difference block 102. The delay block 304 provides an output on line 302 to the first input of the difference block 102.

In FIG. 3, where the delay block 304 is included in the low frequency path, the delay block 204 of FIG. 2 is replaced with a delay block 205. The delay block 205 is designed to match the overall delay of the low frequency path in the frequency range where delay balance is to be applied or is desired. For simplicity the delay block 304 has constant delay in the passband of the low frequency path. This, however, is not essential for delay balance provided variation can be matched by the delay block 205.

It will be observed that the delay variation of block 204 is present on the final output on signal line 120. If this delay variation is undesirable, then the input signal on line 112 may have phase compensation applied.

Exemplary embodiments of the principles of the present invention when used in a modulated power supply are now described with reference to FIGS. 4 and 5. These arrangements show how delay balancing in accordance with the principles of the present invention can be implemented in more practical systems.

Figure 4:
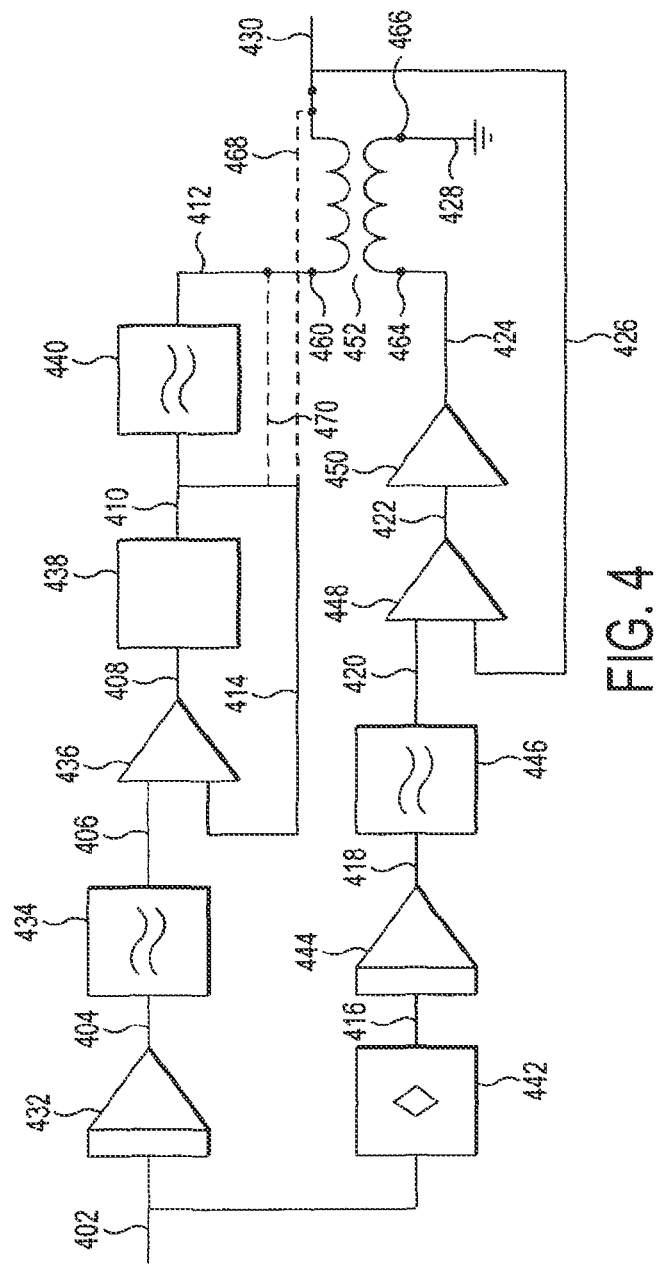
FIG. 4 illustrates an improved modulated power supply in accordance with an embodiment of the invention.

FIG. 4 illustrates an arrangement in which an input signal representing the envelope of a signal to be amplified is provided on an input line 402 in digital form. A digital-to-analogue converter 432 receives the input signal on line 402, and converts it into analogue form on line 404. The digital-to-analogue converter 432 forms a first stage of a low frequency control loop in accordance with this embodiment of the invention. The analogue signal on line 404 passes through a low-pass filter 434. The filter 434 removes high frequencies from the analogue signal prior to further processing, which eliminates aliases caused due to the sampling process in the digital-to-analogue converter 432. In accordance with a particularly preferred embodiment of the invention, the filter 434 may also be utilised to compensate the overall response of the low frequency path as described further hereinbelow.

The filtered analogue signal on line 406 forms a first input to a comparator block 436. The comparator block 436 provides a pulse-width modulated and/or pulse-frequency modulated output on signal line 408. The signal on line 408 at the output of the comparator 436 forms an input to a block 438.

The block 438 is preferably a "switcher" block. As is known in the art, the switcher block 438 switches between a plurality of available power supplies in dependence upon the input signal on line 408. The switcher block 438 therefore converts the low power signal on line 408 delivered by the comparator 436 to a high power signal. The high power signal is delivered by the switcher block 438 on line 410.

A low pass filter 440 receives the high power signal on line 410, and reconstructs an analogue signal on its output 412 based on the pulse-width modulated output from the switcher block 438 on line 410.

The comparator 436, the switcher 438, and the low pass filter 440 thus act as a switch-mode power supply to provide a high power signal on line 412. The high power signal on line 412 is provided to a first tap 460 of a secondary winding of a transformer 452. The transformer 452 operates as the combiner 110 of FIG. 2 or FIG. 3.

A second tap 462 of the secondary winding of the transformer 452 is connected to an output signal line 430 on which an output signal is delivered.

A feedback path of the low frequency loop is provided from the output line 410, and as denoted by line 414 forms a second input to the comparator 436.

A dashed line 468 represents an additional, optional feedback connection/path from the output signal line 430 to the feedback line 414. A dashed line 470 represents an additional, optional feedback connection/path from the line 412 to the feedback path 414. These dash lines show additional feedback being taken either from the system output or the output of the low frequency path in order to improve the low frequency regulation of the system.

The low pass filter 440 is designed for its suitability with the switcher 438, and therefore may not have the required flat amplitude and constant delay response required for the overall operation of the system. In order to compensate for this, the response of the low pass filter 434 may be modified so as to ensure an overall response is provided in the low frequency control loop such that the signal on line 412 has an approximately flat amplitude and constant delay response.

The gain of the digital-to-analogue converter 432, or the magnitude of the digital signal prior to the digital-to-analogue converter 432 on line 402, may be adjusted to provide the required low frequency output on signal line 430.

Turning now to the high frequency control loop, block 442 represents a delay block being a digital delay provided by a conventional circuit capable of being set to a required delay. This delay block receives the input signal on line 402, and generates the delayed input signal on line 416. The delayed digital output signal on line 416 forms an input to a digital-to-analogue converter 444, and a corresponding analogue signal is generated on line 418. A reconstruction low-pass filter 446 receives the analogue signal on line 418, and provides an analogue signal on line 420.

The analogue signal on line 420 forms a first input to a comparator comprised of an analogue summing amplifier 448. The analogue summing amplifier 448 creates a difference between the output from the reconstruction filter 446 on line 420, and the output of the system on line 430 as a result of the system output being fed back on feedback line 426 to a second input of the summing amplifier 448. An appropriate difference signal is thus generated on line 422 at the output of the summing amplifier 448.

The difference signal on line 422 is amplified by a wide band amplifier 450, to provide a medium power signal on line 424. The medium power signal on line 424 is connected to a first tap 464 of a primary winding of the transformer 452.

The transformer 452 combines the outputs of the wideband amplifier 450 on line 424 and the low frequency output on line 412. A second tap 466 of the primary winding of the transformer 452 is connected to ground via a connection 428.

The delay of the delay block 442 is adjusted, in accordance with the principles discussed above, to minimise the low frequency content delivered to the wideband amplifier 450. To achieve low frequency rejection the path gains are also matched in addition to the delay match. This may be achieved by adjusting the relative gain of the digital-to-analogue converters 432 and 444 or their digital input signals.

With the minimisation of the low frequency content, in accordance with the principles of the invention, the transformer 452 does not need to handle low frequency signals and can be designed to operate efficiently at high frequencies. This allows the transformer 452 to be physically small.

As shown in FIG. 4, the connection between the wideband amplifier 450 and the transformer 452 may be single-ended. In alternative arrangements the connection between the wideband amplifier 450 and the transformer 452 may be differential or push-pull, for example, without affecting the function of the delay balancing. The transformer 452 may have an arbitrary turns ratio (for example, 1:2; 1:3; etc.) which may be chosen advantageously to suit the characteristics of the wideband amplifier 450.

Figure 5:
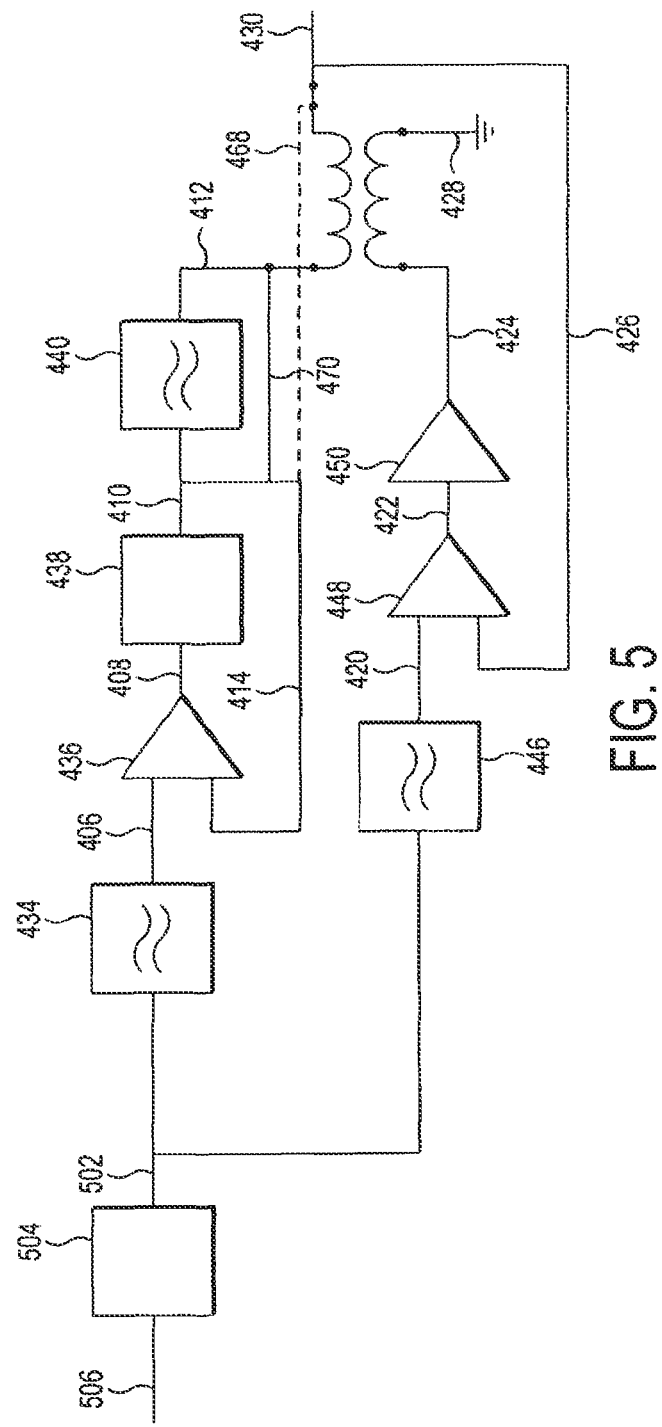
FIG. 5 illustrates an improved modulated power supply in accordance with another embodiment of the invention.

An alternative detailed implementation utilising the principles of the present invention for a modulated power supply is illustrated in FIG. 5. In this arrangement the input signal to the control system is an analogue signal. The analogue input signal is provided on line 502, and forms a direct input to the low pass filter 434 of the low frequency path and also forms a direct input to the low pass filter 446 of the high frequency path.

The all-pass filter 446 is adapted to provide the balancing delay. The all-pass filter 446 has no effect on the amplitude of the signal it processes, but introduces a delay into the high frequency path.

An analogue network, such as the all-pass filter 446, can provide a constant delay only over a limited frequency range. Therefore pre-distortion is preferably applied to the analogue input signal.

A pre-distortion block 504 is therefore preferably provided. The pre-distortion is generated digitally before digital-to-analogue conversion to distribute the analogue signal to the modulator. The pre-distortion block 504 generates on line 502 the analogue input signal for the high frequency and low frequency paths. The pre-distortion provided by the pre-distortion block 504 ensures that the combination of the input signal on line 502 and the filter 446 provide a signal with substantially constant delay on line 420.

In the low frequency path, significantly the pre-distortion does not affect the low frequency path and delay balance can be achieved.

The arrangement of FIG. 5 otherwise operates in a similar fashion to the arrangement of FIG. 4. As in the arrangement of FIG. 4, the pass-band characteristic of the filter 434 may be adjusted to compensate for amplitude and/or delay variation in the filter 440, whilst retaining its stop-band attenuation.

The present invention is described herein by way of reference to particular preferred embodiments, and particularly by way of reference to an application in a modulated voltage supply. This description is, however, only illustrative of examples. In particular the invention may be implemented more broadly in control systems. Envisaged, but not limiting, applications include dynamic power supplies or any wide frequency range power supply.

What is claimed is:

1. A control stage comprising:
   a) a first path for receiving an input signal and for generating a replica signal representing the low frequency content of such signal;
   b) a second path for receiving the input signal and for generating an error signal representing an error in the replica signal, the second path including:
      i) a delay stage for generating a delay signal being a delayed version of the input signal over a frequency range of interest, the delay amount corresponding to a time delay of the first path in generating the replica signal from the input signal, and
      ii) a difference block for receiving as inputs an output signal and the delay signal and for generating the error signal, wherein the delay stage applies a delay to generate the delayed version of the input signal such that the signals at the two inputs of the difference block are substantially identical over the frequency range of interest, and the low frequency content of the error signal generated by the difference block is thereby reduced such that the difference block does not provide substantially any output power over the frequency range of interest; and c) a transformer for combining the replica signal with the error signal to generate the output signal, wherein the transformer is not required to handle low frequency signals in the error signal.

2. The control stage according to claim 1 wherein the delay corresponds to a delay of the first path.

3. The control stage according to claim 1 wherein the delay is calculated such that a low frequency error is removed from the error signal.

4. The control stage according to claim 1 wherein the input signal represents an envelope of a signal.

5. The control stage according to claim 4 wherein the output signal is a signal having a shape corresponding to the envelope.

6. The output stage according to claim 1 wherein the output signal is a high power replica of the input signal.

7. The control stage according to claim 1 in which there is provided, in the first path, a pre-compensation/distortion means to compensate for distortion occurring in the first path, such that the output signal has a flat amplitude and constant delay.

8. The control stage according to claim 1 in which the error signal represents the high frequency content of the error in the replica signal.

9. The control stage of claim 1 wherein the transformer has a first tap of a secondary winding connected to the replica signal and has a second tap of a primary winding connected to the error signal, a combination of the replica signal and the error signal being provided at a second tap of the secondary winding of the transformer.

10. A modulator comprising:
a) a first amplification stage for receiving an input signal and for generating a high power signal being a replica of the low frequency content of the input signal;
b) a second amplification stage for generating an error signal representing an error in the high power signal;
c) a delay stage for generating a delay signal being a delayed version of the input signal over a frequency range of interest, the delay corresponding to a time delay of the first amplification stage in generating the replica from the input signal;
d) a difference block for combining an output signal with the delayed input signal to generate a signal for input to the second amplification stage, wherein the signals at the two inputs of the difference block are substantially identical over the frequency range of interest such that the difference block does not provide substantially any output power over the frequency range of interest, the delay being provided to reduce the low frequency content of the signal for input to the second amplification stage, such that the second amplification stage is not required to handle such signals, the delay increasing the low frequency cut-off of the second amplification stage; and
e) a transformer for combining the high power signal with the error signal generated in dependence on the delayed input signal, wherein the transformer is not required to handle low frequency signals in the error signal.

11. The modulator of claim 10 wherein the first amplification stage includes a switcher and a comparator, the comparator being connected to receive the input signal and the output of the switcher, and to generate a difference signal corresponding to the difference therebetween for providing the input to the switcher.

12. The modulator according to claim 11 further comprising a low-pass filter for filtering the output of the switcher and for providing the first amplification stage output.

13. The modulator according to claim 12 further comprising a low-pass filter for providing the input signal to the comparator of the first amplification stage.

14. The modulator according to claim 13 in which there is provided, in the first amplification stage, a pre-compensation/distortion means to compensate for distortion occurring in the first amplification stage, such that the output signal has a flat amplitude and constant delay.

15. The modulator of claim 10 wherein the transformer has a first tap of a secondary winding connected to the replica signal and has a second tap of a primary winding connected to the error signal, a combination of the replica signal and the error signal being provided at a second tap of the secondary winding of the transformer.

16. A method of generating an output signal comprising a replica of an input signal, the method comprising:
a) generating a replica signal representing the low frequency content of the input signal;
b) generating an error signal representing an error in the replica signal, the generating of the error signal including:
i) generating a delay signal being, a delayed version of the input signal, over a frequency range of interest, the delay amount corresponding to a time delay of the first path in generating the replica signal from the input signal, and
ii) determining a difference between the output signal and the delay signal which difference is the error signal, the signals at the two inputs of the difference block being substantially identical over the frequency range of interest, wherein the delay signal is generated such that the low frequency content of the error signal generated is thereby reduced such that the difference block does not provide substantially any output power over the frequency range of interest; and
c) combining the replica signal with the error signal in a transformer, wherein the transformer is not required to handle low frequency signals in the error signal.

17. The method according to claim 16 wherein the delay corresponds to a delay of the low frequency path.

18. The method according to claim 16 wherein the delay is calculated such that a low frequency error is removed from the error signal.

19. The method according to claim 16 wherein the input signal represents an envelope of a signal.

20. The method according to claim 19 wherein the output signal is a signal having a shape corresponding to the envelope.

21. The method according to claim 16 wherein the error signal represents the high frequency content of the error in the replica signal.

22. The method of claim 16 further comprising connecting the replica signal to a first tap of a secondary winding of the transformer, connecting the error signal to a second tap of a primary winding of transformer, wherein a signal represents the combination of the replica signal and the error signal is generated at the second tap of the secondary winding of the transformer.

* * * * *